United States Patent

Takimoto et al.

[11] 4,226,930
[45] Oct. 7, 1980

[54] ELECTROPHOTOGRAPHIC METHOD FOR PRODUCING PHOTOPOLYMER PRINTING PLATE

[75] Inventors: Yasuyuki Takimoto, Takatsuki; Kunsei Tanabe, Hirakata; Shin Saito, Suita; Masakatsu Nishimura, Settsu; Yasushi Umeda, Osaka, all of Japan

[73] Assignee: Nippon Paint Co., Ltd., Osaka, Japan

[21] Appl. No.: 958,705

[22] Filed: Nov. 8, 1978

Related U.S. Application Data

[63] Continuation-in-part of Ser. No. 816,355, Jul. 18, 1977, abandoned, which is a continuation-in-part of Ser. No. 596,260, Jul. 16, 1975, abandoned.

[51] Int. Cl.² .................. G03G 13/16; G03C 1/68
[52] U.S. Cl. .................. 430/126; 430/300; 430/306; 430/307; 430/396; 430/302
[58] Field of Search .......... 96/1.4, 35.1; 430/306, 430/300, 302, 33, 126, 314

[56] References Cited

U.S. PATENT DOCUMENTS

| | | | |
|---|---|---|---|
| 2,297,691 | 10/1942 | Carlson | 96/1 R |
| 2,947,625 | 8/1960 | Bertelsen | 96/1.4 |
| 2,956,875 | 10/1960 | Ulary | 96/1.4 |
| 3,305,359 | 2/1967 | Delmont | 96/35.1 |

Primary Examiner—John D. Welsh
Attorney, Agent, or Firm—Cook, Wetzel & Egan, Ltd.

[57] ABSTRACT

A method of production of photopolymer printing plates particularly characterized in the transfer procedure. In the method, an electrostatic latent image of original material is produced on a photoconductive medium, the image is developed by application of toner particles, and the toner image is transferred onto photopolymer printing plates having photosensitive resin layer or containing polymerizable monomer through linear pressure of line contact. The toner image thus transferred is then exposed to light without being fixed, plate portions defined by the toner image being subsequently removed together with the toner particles.

11 Claims, 4 Drawing Figures

ELECTROPHOTOGRAPHIC METHOD FOR PRODUCING PHOTOPOLYMER PRINTING PLATE

This application is a continuation-in-part of our co-pending application Ser. No. 816,355, filed on July 18, 1977, and entitled "Printing Plate Production Method" which is a continuation-in-part of the applicant's application Ser. No. 596,260, filed on July 16, 1975, and entitled "Printing Plate Production Method", both now abandoned.

The present invention relates to a method for production of photopolymer printing plates by applying an electrophotographic process and, more particularly, to a method for automatic production of one or more heavy duty photopolymer printing plates by forming on said plates a powder image corresponding to image of a document to be printed, said method being particularly characterized in transfer procedure involved therein.

There are known various methods for production of letter press, lithographic or other plates for printing purposes. One of such known method, for example, the silver salt film method has the disadvantages that comparatively skilled staff are required to perform the photographic development and positioning of the film on a plate, and that, even with skilled staff, production of a plate is slow, while, in the production of plates according to this method, increased cost of silver employed in the photographic film and disposal of heavy metals contained in emulsions or other waste fluids exhausted from the development stage are brought into question.

Other methods for production of printing paltes employing electrophotographic techniques are already known, and certain methods of making relief printing plates of metal and lithographic printing plates have been proposed, for example, in U.S. Pat. Nos. 3,821,931 of Yamaji et al., 3,451,336 of Mignone, et al., and 3,861,306 of DuBois et al., and British Pat. No. 1,215,513, in which the toner powder image obtained by electrophotographic method is fixed either directly or after transfer to use the toner powder image as ink receptor for the production of the lithographic printing plates, with the arrangement as described above being formed as one unit with the printing press. Meanwhile, in the known methods disclosed, for example, in U.S. Pat. No. 3,071,070 of Mattews et al., and Japanese Patent Publication Tokkaisho No. 42/5366, the toner powder image obtained by the electrophotographic method is transferred onto a metallic plate or metallic plate coated with resin to utilize the toner powder image thus transferred as the ink receptor or resist of the coated resin, by a transfer method disclosed, for example, in U.S. Pat. No. 3,071,070.

It should be noted here, however, that the prior arts as described above aim at application thereof only to lithographic printing plates, and cannot be applied to the photopolymer printing plates as dealt with in the present invention.

Additionally, in the conventional methods disclosed, for example, in U.S. Pat. Nos. 3,305,359 of Delmont et al., 2,939,787 and 3,121,009 of Giamino et al., photoconductive layer is applied onto a metallic plate or photoresist to form a toner image on said layer for utilizing the toner image as resist of the metallic plate, photoresist or photoconductive layer. The prior art methods as described above also have disadvantages in that, although they may be applied to the photopolymer printing plates, it is required to apply the photoconductive layer on the metallic plate and the like, and thus commercially available printing plates cannot be used as they are.

As is understood from the foregoing description, production of printing plates by the toner powder image transfer has been limited to the field of lithographic printing plates, and for production of letter press printing plates, application of the photoconductive layer is inevitably required.

It is accordingly a principal object of the invention to provide a method for completely automatic production of photopolymer printing plates suitable for heavy duty through an improved transfer procedure involved.

It is a further object of the invention to provide a method for production of printing plates which is economical, reduces generation of harmful waste substances, and permits a free choice of materials, including printing plate material employed.

It is another object of provide a method for production of printing plates of the above described type wherein contents of an original document received as signals of a facsimile transmission system, for example, may be reproduced directly and automatically on the surface of printing plate for producing impressions of said document. Before the description of the present invention proceeds, it is to be noted that the photopolymer printing plates mentioned above and referred to hereinafter have photosensitive resin layers in which solubility of the photosensitive resin layer toward solvents are varied by projection of light thereto so as to provide surface differentiations in the order of 1 to 3,000μ.

It should sldo be noted here that the present invention advantageously presents a production method of printing plates in which the toner powder image is transferred onto commercially available photopolymer printing plates through a transfer method by which the present invention is particularly characterized.

These and other objects and features of the present invention will become apparent from the following description taken in conjunction with the preferred embodiment thereof with reference to the attached drawings in which.

Figure 1:
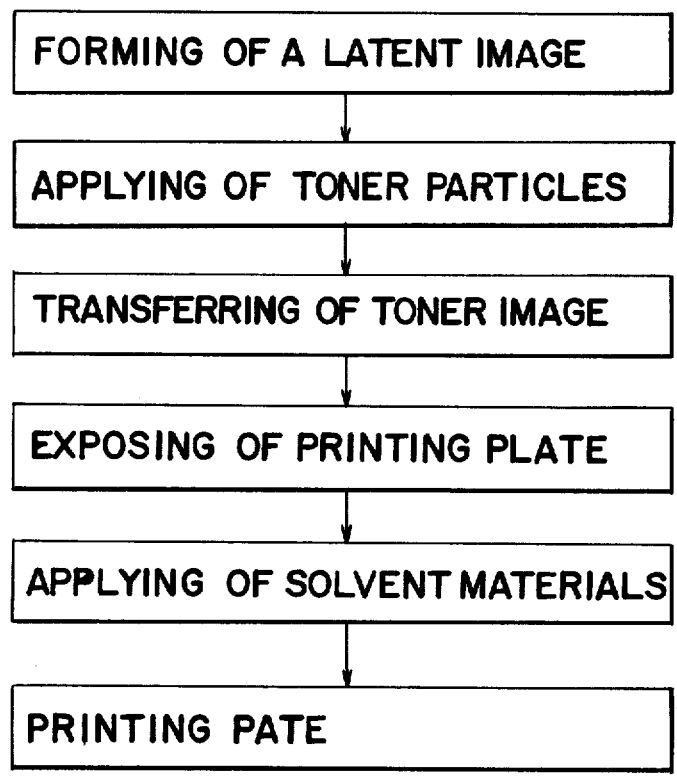
FIG. 1 is a flow chart illustrating the printing plate production method according to the present invention.

The present invention will be described below in reference to the attached drawing of FIG. 1, which is a flow chart of the method according to the invention. According to the present invention, there is provided a method of producing photopolymer printing plates having surface differentiations in the order of 1 to 3,000μ comprising the steps of forming an electrostatic latent image corresponding to the image of a document to be printed onto a photoconductive medium by corona charging and exposing in accordance with the image formation of said document, applying toner particles onto said electrostatic latent image to form a toner image on said photoconductive medium, transferring said toner image onto a photopolymer printing plate by the engagement of both surfaces of said photoconductive medium and printing plate under pressure, exposing the entire surface of said printing plate with toner particles and applying solvent materials onto said printing plate to form surface differentiations thereon corresponding to said toner image after removing said toner particles from said printing plate. In the method of producing photopolymer printing plates according to the present invention as described above, the image exposure is normally effected by an optical lens system, but the scanning system may be employed for the purpose, depending on the necessity, with facsimile signals, magnetic tape records, computer outputs, etc., being used as inputs for the scanning.

The light beam employed for scanning the photoconductive medium is suitably a laser beam. The light of such a beam being highly coherent permits high fidelity reproduction of document contents, and is preferably a gas laser beam, for example, a helium cadmium beam having a wavelength of 441.6 nm, an argon beam having a wave length of 488.0 nm or 514.5 nm, or helium neon beam having a wavelength of 632.8 nm. The laser beam must have an intensity of light sufficient to permit the photoconductive medium to sensitize to it and, therefore, is normally in the order 0.1 to 100 mW, and preferably in the range 1 to 20 mW. If power is less than this it is not possible to produce an electrostatic latent image at high scanning speed, and if more there is the disadvantage that equipment must be larger and cooling means are required.

The photoconductive medium is normally of a material such as zinc oxide, but may suitably be a chalcogenite compound inlcuding at least one substance selected from the group comprising sulfur, selenium or tellurium since such a medium has the ability to act as a 'memory', i.e., to retain a latent image formed thereon. Thus, it is possible to use the same sheet or plate of material for production of more than one printing plate. The 'memory' characteristics of the medium may be enhanced by additions of silicon, gallium, germanium, arsenic, cadmium, or antimony, for example. Alternatively, the photoconductive medium may of course be a material such as cadmium sulfide, organic semiconductor, or other electrophotographic photoreceptors.

The electrostatic latent image thus formed is then dusted or brushed with toner particles which dispose themselves on the photoconductive medium corresponding to the image. The particle size of the toner particles employed is preferably in the order of 1 to 10$\mu$, but for practical purposes, may be in the range of 0.5 to 20$\mu$. It was found that, for particle diameter above this range, although good contrast is achieved, resolution becomes worse whereas, for smaller particles, although resolution becomes better, contrast is poor.

Next, the toner image is transferred from the surface of the photoconductive medium directly onto photopolymer plate material intended to be formed into printing plate, by bringing the toner image bearing surface of the photoconductive medium and photosensitive resin layer surface of the photopolymer printing plate into close line contact with each other under substantially high and uniform pressure in the range from 1 to 40 kg/linear cm of line contact for only applying a rolling motion therebetween at a slow rolling speed in the range from 1 to 10cm/sec to cause an adhesion of the power image onto the photosensitive resin layer surface of the photopolymer printing plate.

Figure 2:
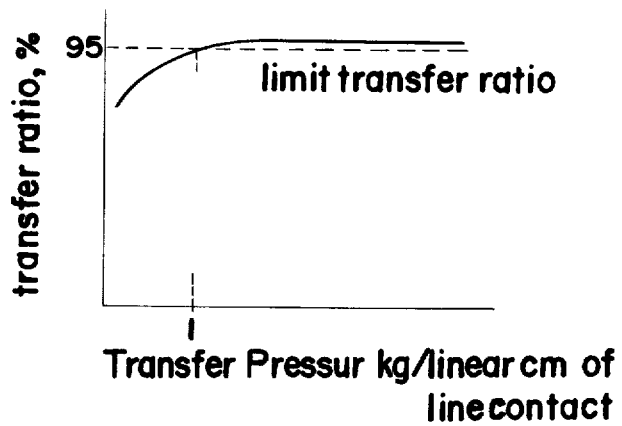
FIG. 2 is a graph showing relation between transfer pressure and transfer ratio in transfer procedure employed in the method of FIG. 1.

The transfer pressure is high at 1 to 40 kg/linear cm of line contact and preferably at 5 to 30 kg/linear cm of line contact. In FIG. 2 showing relation between the transfer pressure and transfer ratio, it is noticed that if the transfer pressure is smaller than a predetermined limit, the transfer ratio is deteriorated, while the resolution will be lowered, if the transfer pressure is higher than the predetermined limit, and therefore, the predetermined limit should be altered according to purposes.

Figure 3:
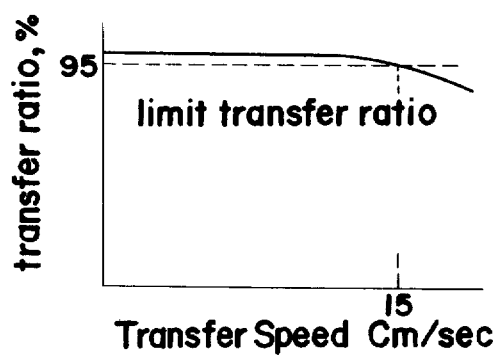
FIG. 3 is a similar graph to FIG. 2, but particularly shows relation between transfer speed and transfer ratio in the transfer procedure employed in the method of FIG. 1.

The transfer speed is small at 1 to 15 cm/sec and preferably at 2 to 10 cm/sec. In FIG. 3 showing relation between the transfer speed and transfer ratio, it is noticed that if the transfer speed is lower than a predetermined limit, it does not suit to practical purpose, while the transfer ratio will be deteriorated, if the transfer speed is higher than the predetermined limit.

Figure 4:
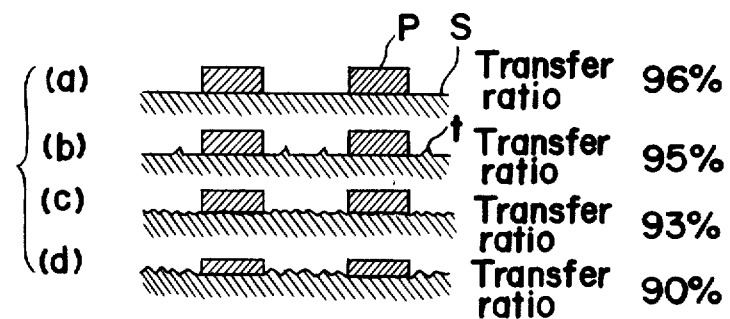
FIG. 4 is fragmentary cross sectional views each showing state of the surface of the printing plate produced.

In (a) to (d) of FIG. 4 showing state of the solid portion S of the toner powder image formed on the photoconductive medium with respect to the surface P thereof, it is noticed that the transfer rate of 95% sufficiently serves the purpose, although small points t still remain on the solid portion. In this case, the reflecting density of 1.68 of the powder image is required at the solid portion.

If the transfer ratio is deteriorated due to presence of electrostatic attraction between the toner particles and photoconductive medium, it is preferable to reduce coulomb force through suitable treatments before the transfer, for example, by projection of light over the entire upper or lower surface of the photoconductive medium, or by charging of the toner particles through application of corona charge having the same polarity as the photoconductive medium from the surface. It is considered that in the former treatment, the coulomb force is reduced, since the photoconductive medium is rendered to be conductive for discharging by the light projection, while in the latter treatment, the coulomb force is suspended from exerting or reduced, when the charge of the toner particles is neutralized by the charging to be of the same polarity as that of the photoconductive medium.

Although the transfer to the photopolymer printing plate is difficult to be effected by the conventional transfer techniques due to excessively small coulomb force available, the adhesion property at the surface of the photopolymer printing plate is advantageously utilized in the transfer procedure according to the present invention, with the transfer through the adhesion being achieved by increase of pressure. What contribute to such tranfer through adhesion are adhesion property of the polymer itself, adhesion of low molecular weight compounds contained, adhesion of low molecular weight compounds due to penetration, swelling or fusion of the toner particles, adhesion effect due to oozing of inner low molecular weight compounds onto the plate surface by application of pressure, and effect of emulsifying agents, plasticizers, solvents, monomer and other additives, or polymerizable monomer inevitably contained in the photopolymer printing plate.

In the case where thickness of the photosensitive resin layer of photopolymer printing plate is small, voltage may be applied simultaneously. The voltages applied are in the range from 350 to 1,500 V and preferably from 400 to 900 V. In the above case, small transfer pressures in the region from 1 to 10 kg/linear cm of line contact are sufficient for the purpose. It is to be noted that, in principle, the voltage impression should preferably be not employed, since it may result in spark discharge and reduction in resolution, but that such voltage impression is effective even at the sacrifice of the resolution to a certain extent in cases where the surface addhesion is small wherein oozing of the inner low molecular weight compounds can not be expected due to small layer thickness.

Next, the entire surface of the photopolymer printing plate material now carrying the toner image is exposed, over its whole area, to light from a source selected in reference to the type of plate material and able to effect a chemical change, for example, in portions of the material unprotected by toner particles. Examples of a light source are an arc lamp, high pressure mercury lamp, xenon lamp, or halogen lamp. After exposure, the unprotected or exposed portions are removed in a manner which is also selected according to the type of material. The removal may be effected by washing in water, an alkali solution or an organic solvent, alone or combined with water, respectively depending on the kinds of photopolymer printing plates. The toner particles defining the image are of course removed during this process since they are not particularly bonded or fused as they merely need to be retained on the surface of the printing plate material a sufficient time to permit exposure.

It is to be noted that, since toner particles are not normally required to be fused or otherwise bonded at stages of the printing plate production, the particles merely need to have suitable qualities permitting them to retain a pattern upon application of an electrical potential. Unlike toner particles employed in conventional processes, the toner employed in accordance with the present invention does not require addition of thermoplastic binder material or similar additives. In other words, cost of the toner is less, and conditions relating thereto, both during storage and during the production process, are less strict.

As a finishing process, the plate may be heat-dried or again exposed to light, or a hardening agent or similar material may be coated thereon.

Printing plates thus produced may be relief, intaglio or planographic printing plates, having surface differentiation in the order of 1 to 3,000μ, and having good precision for production of impressions of good quality, 85 screen lines per inch with 5% highlight being obtained in lithographic plates and 65 screen lines per inch with 5% highlight in resin relief printing plates, and an average resolution of 8 lines/mm was obtainable. A main advantage of the invention is useable for making impressions, rather than for example a surface of weaker resin, etc., the plates are suited to newspaper purposes or other heavy service. When duplication of the printing plate is to be obtained, the similar processes as described above may be repeated. If it is impossible to repeat the processes as in a facsimile reception unit, the purpose may be achieved either by using the state of the toner image as an original or by re-scanning through memorization in magnetic tapes, etc.

Further, when a photoconductive medium having the 'memory' characteristics is employed, a second plate may be produced if required by re-applying toner particles to the photoconductive medium and then repeating the subsequent steps described above, it being unnecessary to repeat the expensive process of facsimile transmission.

Examples of application of the invention are given below. For convenience, Example 1 may be regarded as representative, although by no means limiting.

EXAMPLE 1

A negative charge of 600 V was imposed on the surface of a commercially available zinc oxide photoconductive medium, RICOHFAX PAPER TYPE 200, manufactured by Kabushiki Kaisha Ricoh of Japan by a corotron type corona charger, with subsequent exposure of the surface of the photoconductive medium thus charged to light images reflected from a document for the formation of an electrostatic latent image corresponding to the image of the document on said photoconductive medium surface, which was then developed by the magnetic brush developing method. The developing material employed therefor was a mixture of toner particles having particle size in the order of 3 to 10μ and iron particles, TEFV 200/300, manufactured by Nippon Teppun Co., Ltd. of Japan at a weight ratio of 10/90. The toner powder image thus obtained had reproduction of a 5 to 95% halftone of 65 screen lines per inch with toner powder layer thickness of 12μ and solid portion reflecting density of 1.78. Subsequently, the toner image on the photoconductive medium was transferred onto a photopolymer printing plate in such a manner that the photoconductive medium bearing the toner image on the surface thereof was fed along a curvature of an upper cylinder of two cylinders (each having diameter of 100 mm and length of 500 mm) juxtaposed and arranged in parallel to each other, while photopolymer letter press printing plate, NAPP 30-PAN manufactured by NAPP systems (U.S.A.) Inc., and subjected to preliminary exposure to light of a 3 KW high pressure mercury vapor lamp spaced a distance of 70 cm therefrom for 6 seconds, was fed horizontally between the cylinders from the same side as that for feeding the photoconductive medium, with a linear pressure of 20 kg/linear cm of line contact being applied between the photoconductive medium and the photopolymer printing plate for transferring the toner image on the photoconductive medium onto the photopolymer printing plate at a speed of 3 cm/sec and transfer ratio of 96%. It is to be noted here that what is represented by the transfer ratio is:

$$(1 - \frac{\text{weight of toner remaining on photoconductive member after transfer}}{\text{weight of toner adhering to photoconductive member before transfer}}) \times 100\ (\%)$$

The photopolymer printing plate on the surface of which the toner image was transferred in the above described manner was subjected to projection of light over its entire surface by the 3 KW high pressure mercury vapor lamp spaced a distance of 70 cm for 47 seconds, and subsequently the toner on the photopolymer printing plate was removed by acetone. The unexposed portion of the photopolymer printing plate thus obtained was washed for 3 minutes in water having a temperature of 38° C. and pressure of 2 kg/cm², and after drying, a letter press printing plate of newspaper full page size with reproduction of a 5 to 95% halftone of 65 screen lines/inch was obtained, making it possible to print 150,000 copies by a rotary press machine.

EXAMPLE 2

The surface of the photoconductive medium on which the toner image had been formed in the same manner as in Example 1 was exposed for 20 seconds to light from a light source including ten 20 W chemical lamps and spaced a distance of 5 cm from said surface. Subsequently, the transfer was carried out in the similar procedure to that in Example 1, with a transfer ratio of 98%. After subjection of the photopolymer printing plate now carrying the toner image thus transferred thereonto to exposure and washing in water in the same manner as in Example 1, a letter press printing plate having good resolution, with a 5 to 95% halftone of 65 screen lines per inch was obtained.

EXAMPLE 3

Procedure was generally the same as in Example 1, except that the linear pressure was altered to 35 kg/linear cm of line contact, with the transfer speed being changed to 5 cm/sec, and there was produced a letter press printing plate having good resolution, with a 5 to 95% halftone of 65 screen lines per inch was obtained at a transfer ratio of 98%.

EXAMPLE 4

The photoconductive medium bearing on its surface the toner powder image formed in the same manner as in Example 1 was secured on a pressure roll surface of a rolling machine (manufactured by Kaneda Kikai Co., Ltd. of Japan) including an upper roll and a lower surface plate and preliminarily set to be 0.60 mm in the gap therebetween, while a photopolymer letter press printing plate, NAPP 30-PAN (manufactured by NAPP systems (U.S.A.) Inc.) which had been preliminary exposed in the similar manner as in Example 1 was placed on the surface plate, with the pressure roll and the surface plate being driven at a speed of 5 cm/sec for transfer at a transfer ratio of 98%. The photopolymer letter press printing plate onto which the toner powder image had been transferred in the above described manner was processed in the same procedure as in Example 1, and a photopolymer letter press printing plate equivalent in quality to that in Example 1 was obtained.

EXAMPLE 5

The surface of the photoconductive medium carrying thereon the toner powder image formed in the same procedure as in Example 1 was subjected to negative corona charging through application of a voltage of $-6,000$ V for 20 seconds at a distance of 20 mm above said surface. With subsequent procedure in the similar manner as in Example 1, a photopolymer letter press printing plate of newspaper full page size having good resolution with a 5 to 95% halftone of 65 screen lines per inch was obtained. The transfer ratio in the above case was 97%.

EXAMPLE 6

A negative charge of 600 V was imposed on the surface of a commercially available zinc oxide photoconductive medium, RICOFAX PAPER TYPE 200, manufactured by Kabushiki Kaisha Ricoh of Japan by a corotron type corona charger, with subsequent exposure of the surface of the photoconductive medium thus charged to light images reflected from a document for the formation of an electrostatic latent image corresponding to the image of the document on said photoconductive medium surface, which was then developed by the magnetic brush developing method. The developing material employed therefor was a mixture of toner particles having particle size in the order of 3 to $10\mu$ and iron particles, TEFV 200/300, manufactured by Nippon Teppun Co., Ltd. of Japan at a weight ratio of 10/90. The toner powder image thus obtained had reproduction of a 5 to 95% halftone of 65 screen lines per inch with toner powder layer thickness of $12\mu$ and solid portion reflecting density of 1.78. Subsequently, the toner image on the photoconductive medium was transferred onto a photopolymer printing plate in such a manner that the photoconductive medium bearing the toner image on the surface thereof was fed along a curvature of an upper cylinder of two cylinders (each having diameter of 100 mm and length of 500 mm) juxtaposed and arranged in parallel to each other without the preliminary exposure of the toner image to light, while photopolymer letter press printing plate, TORELIEF TYPE GA95 manufactured by Toray Co., Ltd. of Japan was fed horizontally between the cylinders from the same side as that for feeding the photoconductive medium, with a linear pressure of 30 kg/linear cm of line contact being applied between the photoconductive medium and the photopolymer printing plate for transferring the toner image on the photoconductive medium onto the photopolymer printing plate at a speed of 3 cm/sec and transfer ratio of 95%.

The photopolymer printing plate on the surface of which the toner powder image was thus transferred was subjected, on its entire surface, to exposure to light from a 2 KW super high pressure mercury vapor lamp for 2 minutes, with subsequent washing of unexposed portion with a brush in 90% modified ethanol for 90 seconds, and as a result, a letter press printing plate of newspaper full page size having good resolution with a 5 to 95% halftone of 65 screen lines per inch was obtained.

EXAMPLE 7

A negative charge of 600 V was imposed on the surface of a commercially available zinc oxide photoconductive medium, RICOHFAX PAPER TYPE 200, manufactured by Kabushiki Kaisha Ricoh of Japan by a corotron type corona charger, with subsequent exposure of the surface of the photoconductive medium thus charged to light images reflected from a document for the formation of an electrostatic latent image corresponding to the image of the document on said photoconductive medium surface, which was then developed by the magnetic brush developing method. The developing material employed therefor was a mixture of toner particles having particle size in the order of 3 to $10\mu$ and iron particles, TEFV 200/300, manufactured by Nippon Teppun Co., Ltd. of Japan at a weight ratio of 10/90. The toner powder image thus obtained had reproduction of a 5 to 95% halftone of 65 screen lines per inch with toner powder layer thickness of $12\mu$ and solid portion reflecting density of 1.78. Subsequently, the toner image on the photoconductive medium was transferred onto a photopolymer printing plate in such a manner that the photoconductive medium bearing the toner image on the surface thereof was fed along a curvature of an upper cylinder of two cylinders (each having diameter of 100 mm and length of 500 mm) juxtaposed and arranged in parallel to each other, without the preliminary exposure of the toner image to light while photopolymer flexographic printing plate, NIPPE RUNAFLEX H-10-A2 manufactured by NIPPON PAINT Co., Ltd. of Japan was fed horizontally between the cylinders from the same side as that for feeding the photoconductive medium, with a linear pressure of 15 kg/linear cm of line contact being applied between the photoconductive medium and the photopolymer flexographic printing plate for transferring the toner image on the photoconductive medium onto the photopolymer flexographic printing plate at a speed of 3 cm/sec and transfer ratio of 96%. The surface of the flexographic printing plate having the toner powder image transferred thereon was subjected, on its entire surface, to exposure to light from a 2 KW high pressure mercury vapor lamp for 3 minutes, with subsequent washing of unexposed portion with a brush in a mixed solvent of trichloroethane/isopropyl alcohol for 3 minutes, and thus a photopolymer flexographic letter press printing plate having good resolution with a 5 to 95% halftone of 65 screen lines per inch was obtained.

EXAMPLE 8

A negative charge of 600 V was imposed on the surface of a commercially available zinc oxide photoconductive medium, RICOHFAX PAPER TYPE 200, manufactured by Kabushiki Kaisha Ricoh of Japan by a corotron type corona charger, with subsequent exposure of the surface of the photoconductive medium thus charged to light images reflected from a document for the formation of an electrostatic latent image corresponding to the image of the document on said photoconductive medium surface, which was then developed by the magnetic brush developing method. The developing material employed therefor was a mixture of toner particles having particle size in the order of 3 to $10\mu$ and iron particles, TEFV 200/300, manufactured by Nippon Teppun Co., Ltd. of Japan at a weight ratio of 10/90. The toner powder image thus obtained had reproduction of a 5 to 95% halftone of 65 screen lines per inch with toner powder layer thickness of $12\mu$ and solid portion reflecting density of 1.78. Subsequently, the toner image on the photoconductive medium was transferred onto a lithographic PS plate, PLANO SUPER POSITIVE GRANEKOTE "SGP type 192" (manufactured by Fuji Photo Film Co., Ltd. of Japan), in such a manner that the photoconductive medium bearing the toner image on the surface thereof was fed along a curvature of an upper cylinder of two cylinders (each having diameter of 100 mm and length of 500 mm) juxtaposed and arranged in parallel to each other, while the lithographic PS plate was fed, without any preliminary exposure of light thereto, horizontally between the cylinders from the same side as that for feeding the photoconductive medium, with a voltage of 500 V being impressed between substrates of the photoconductive medium and the lithographic PS plate, while a linear pressure of 5 kg/linear cm of line contact is applied between the photoconductive medium and the lithographic PS plate for transferring the toner image on the photoconductive medium onto the lithographic PS plate at a speed of 3 cm/sec and transfer ratio of 97%. The surface of the lithographic PS plate carrying the toner powder image thus transferred thereonto was subjected, on its entire surface, to exposure to light for 15 seconds from a 3 KW high pressure mercury vapor lamp spaced a distance of 70 cm from said surface, and thereafter subjected to immersion development for 1 minute in Developer #985A (manufactured by Fuji Photo Film Co., Ltd. of Japan) maintained at 20° C. The lithographic PS printing plate thus obtained had good resolution with a 5 to 95% halftone of 85 screen lines per inch.

EXAMPLE 9

In this Example, the zinc oxide photoconductive medium described as employed in Example 1 was replaced by a commercially available dye sensitized zinc oxide photoconductive medium, Hitachi color copy paper (manufactured by Hitachi Seisakusho Co., Ltd. of Japan), and through the same procedure as in Example 1, the photoconductive medium which carried toner powder image having reproduction of a 5 to 95% halftone of 65 screen lines per inch with film thickness of $10\mu$ and solid portion reflecting density of 1.76 was obtained. After subsequent transfer and processing in the same procedure as in Example 1, a letter press printing plate having good resolution with a 5 to 95% halftone of 65 screen lines per inch was obtained.

EXAMPLE 10

In a facsimile reception unit, a zinc oxide photoconductive medium similar to the one used in Example 9 was wound onto the outer surface of a rotary drum, and the surface of the photoconductive medium was imparted with a potential of $-650$ V through the corotron type corona charger, while the rotary drum was being rotated at 3,000 r.p.m. Subsequently, the photoconductive medium was exposed to image-wise light emitted by a 10 mW helium-neon laser to correspond to input signals and having scanning density of 422 lines per inch to form a latent image on the surface of the photoconductive medium. The photoconductive medium thus exposed was removed from the rotary drum for developing the latent image into a toner powder image through the developing method as described with reference to Example 1. The toner powder image thus obtained had reproduction with a 5 to 95% halftone of 65 screen lines per inch, with film thickness of $9\mu$ and solid portion reflecting density of 1.75. After subjecting the photoconductive medium carrying the developed toner powder image thereon to the transfer and processings in the same manner as in Example 1, a letter press printing plate with good resolution having a 5 to 95% halftone of 65 screen lines per inch was obtained.

EXAMPLE 11

In this Example, the zinc oxide photoconductive medium described as employed in Example 10 was replaced by a photoconductive medium composed of an alloy photosensitive layer of 47%Te, 10%Ge, 31%As and 12%Si, which was wound on the outer surface of a rotary drum and subjected to exposure to laser light emitted by a 15 mW helium-neon laser as in Example 10. The photoconductive medium thus exposed was imparted with positive charge by a $-5,700$ V corotron type corona charger and then developed in the similar manner to that in Example 1. The photoconductive medium carrying the thus developed toner powder image was subsequently subjected to the transfer and processings in the same procedure as in Example 10, and thus a letter press printing plate with good resolution having a 5 to 95% halftone of 65 screen lines per inch was obtained.

Main advantages of the method of the invention may be summarized as follows.

(1) Production is completely automatable and production time per plate is shorter than in conventional methods, with no operators being required for plate production by the present method, which thus offers the advantages of staff and time, while ensuring production of high-quality printing plates.

(2) As well as a free choice of image element transmission mode, there is permitted use of practically all types of printing plate material, and it is possible for example to use one and the same associated equipment for production of printing plates of different materials and in response to variously transmitted image elements, only easily-effected adjustments being required in change-over from one type of plate production to another.

While specific examples of method have been described, variations within the scope of the claims are possible and are contemplated. There is no intention therefore of limitation to the exact details described.

Although the present invention has been fully described in conjunction with the preferred embodiments, it should be noted that various changes and modifications are apparent to those skilled in the art. Therefore, unless they depart from the true scope of the present invention, such changes and modifications should be construed as included within such scope of the present invention.

What is claimed is:

1. A method of producing a photopolymer printing plate comprising the steps of
    (a) forming a powder image on a photoconductive medium electrophotographically,
    (b) transferring the powder image from the surface of the photoconductive medium directly onto a photopolymer printing plate by bringing the powder image bearing surface of the photoconductive medium and photosensitive resin layer surface of the photopolymer printing plate into close line contact with each other under a uniform pressure in the range from 1 to 40 Kg/linear cm of line contact and applying a rolling motion therebetween at a speed in the range from 1 to 10 cm/sec. and sufficient to cause an adhesion of the powder image onto the photosensitive resin layer surface of the photopolymer printing plate,
    (c) exposing the entire powder image bearing surface of the photopolymer printing plate to a light, and
    (d) applying solvent material to the exposed photopolymer printing plate thereby forming surface differentiations therein corresponding to the powder image.

2. The method for producing photopolymer printing plates as claimed in claim 1, wherein said powder image has reflecting density over 1.68.

3. The method for producing photopolymer printing plates as claimed in claim 1, wherein said powder image transfer is effected by simultaneous application of electrostatic voltage.

4. The method for producing photopolymer printing plates as claimed in claim 1, wherein said solvent material is applied to said exposed printing plate after removing the toner particles therefrom.

5. The method for producing photopolymer printing plates as claimed in claim 1, wherein said steps (a) to (d) are repeated for continuous production of the printing plates.

6. The method for producing photopolymer printing plates as claimed in claim 1, wherein electrostatic attraction acting between said photoconductive medium and said powder image formed thereon is reduced prior to transferring the powder image from the surface of the photoconductive medium.

7. The method for producing photopolymer printing plates as claimed in claim 1, wherein said photoconductive medium which has said powder image formed thereon is exposed to light over its entire surface for reducing electrostatic attraction acting between said photoconductive medium and said powder image.

8. The method for producing photopolymer printing plates as claimed in claim 1, wherein said photoconductive medium is subjected to electrical charging which has the same polarity as that of an electrostatic latent image formed on said photoconductive medium from its surface bearing said powder image for reducing electrostatic attraction acting between said photoconductive and said powder image.

9. The method for producing photopolymer printing plates as claimed in claim 1, wherein said photopolymer printing plate includes a low molecular weight compound having such property as to cause said powder image to adhere onto said photopolymer printing palte by partially allowing said powder image on said photoconductive medium to selectively fuse and swell.

10. The method for producing photopolymer printing plates as claimed in claim 1, wherein said photopolymer printing plate includes polymerizable monomer having such property as would cause said powder image to adhere onto said photopolymer printing plate by partially allowing said powder image on said photoconductive medium to selectively fuse and swell.

11. The method for producing photopolymer printing plates as claimed in claim 1, wherein the relative rolling speed between the powder image bearing surface of the photoconductive medium and the photosensitive resin layer surface of the photopolymer printing plate is in the range of from approximately 1 to 10 cm/sec, and thereby sufficient to cause an adhesion of the powder image onto the photosensitive layer surface of the photopolymer printing plate.

* * * * *